US006736929B2

(12) United States Patent
Komandur et al.

(10) Patent No.: US 6,736,929 B2
(45) Date of Patent: May 18, 2004

(54) DISTRIBUTED CONTROL SYSTEM FOR SEMICONDUCTOR MANUFACTURING EQUIPMENT

(75) Inventors: Srinivasan M. Komandur, San Jose, CA (US); Jalal Ashjaee, Cupertino, CA (US)

(73) Assignee: NuTool, Inc., Milpitas, CA (US)

( * ) Notice: Subject to any disclaimer, the term of this patent is extended or adjusted under 35 U.S.C. 154(b) by 83 days.

(21) Appl. No.: 10/199,924

(22) Filed: Jul. 19, 2002

(65) Prior Publication Data

US 2003/0155073 A1 Aug. 21, 2003

Related U.S. Application Data

(60) Provisional application No. 60/357,148, filed on Feb. 15, 2002.

(51) Int. Cl.[7] .......................... H05H 1/00; C23C 16/00; H01L 21/00
(52) U.S. Cl. .......................... 156/345.32; 156/345.31; 118/719; 438/689
(58) Field of Search .................. 156/345.32, 345.31; 118/719, 715; 438/689, 706; 437/710

(56) References Cited

U.S. PATENT DOCUMENTS 6,224,638 B1 * 5/2001 Jevtic et al. ................ 29/25.01
6,251,759 B1 * 6/2001 Guo et al. .................. 438/584
6,368,880 B2 * 4/2002 Singhvi et al. ................ 438/5

FOREIGN PATENT DOCUMENTS

WO          WO 200229861 A2 * 4/2002 ........... C23C/16/00

* cited by examiner

*Primary Examiner*—Parviz Hassanzadeh
(74) *Attorney, Agent, or Firm*—NuTool Legal Department

(57) ABSTRACT

A semiconductor workpiece processing tool includes process modules having a robot loading window and a manual loading window, and a control system for managing a production route defining movement of the workpiece among a number of the process modules. The control system includes a user interface through which an operator can define the production route and recipes to be performed on the workpiece in each of the process modules, a system controller for controlling execution of the production route, a process module controller associated with each of the process modules for controlling the processing of the workpiece in the process module, and a network connecting the control system components. Advantages of the invention include the ability to continue a production route while manually operating a process module. As a result, the tool may continue in operation while selected process module are tested, maintained or otherwise used to process workpieces.

8 Claims, 6 Drawing Sheets

GUI Computer

System Controller

Process Module Controller

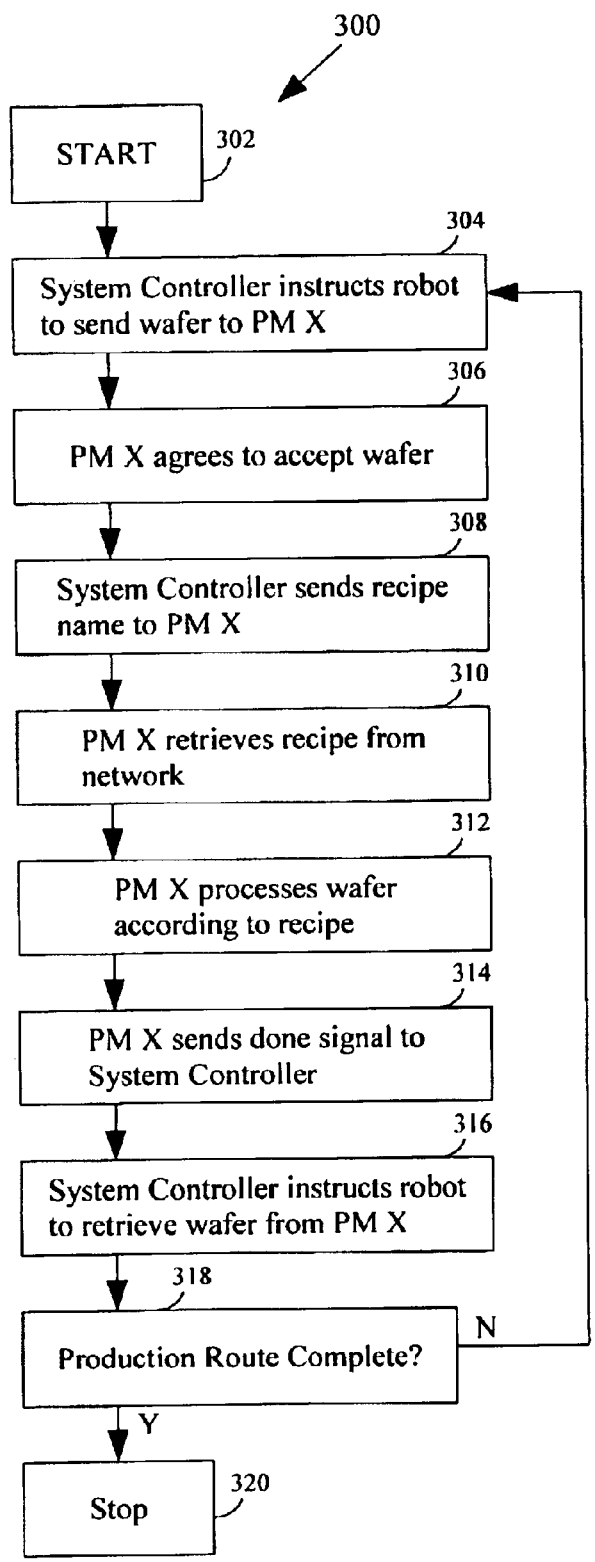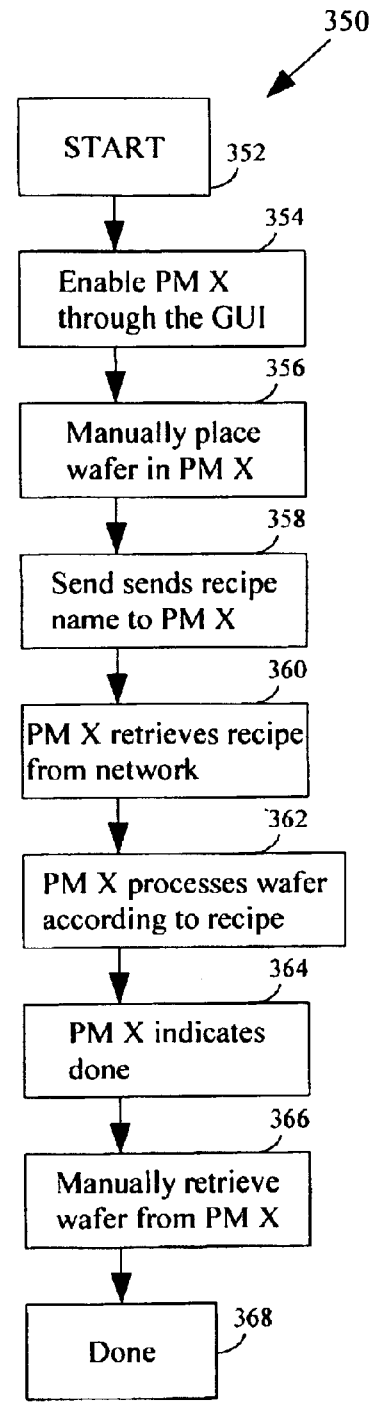
FIG. 4A
Production Mode
FIG. 4B
Manual Mode

DISTRIBUTED CONTROL SYSTEM FOR SEMICONDUCTOR MANUFACTURING EQUIPMENT

RELATED APPLICATIONS

This application claims priority to Prov. No. 60/357,148, filed Feb. 15, 2002, incorporated herein by reference.

FIELD

The present invention relates to a distributed control system for semiconductor manufacturing equipment, and more particularly to a computer controlled apparatus and method for improving semiconductor processing.

BACKGROUND

In the semiconductor industry, various processes can be used to deposit and etch materials on the workpieces, which may also be referred to as wafers. These processes are typically carried out by various machine tools, or may be carried out in the same tool using various chambers. Conventional processing chambers are designed in multiple processing stations or modules that are arranged in a cluster to form a cluster tool or system. Such cluster tools or systems are often used to process a multiple number of wafers at the same time. Generally, cluster tools are configured with multiple processing stations or modules and are designed for a specific operation. However in such conventional cluster tools, deposition and cleaning processing steps both typically require separate chambers. Consequently, a wafer is typically moved to another station or system in order to be processed and cleaned. Since the environment must be clean of contaminants, a robot is typically used to move the workpiece from one chamber to another inside the cluster tool.

A software control program is used to control the robot for moving the workpieces around in the tool (called a production route), and for loading recipes to each of the processing chambers. The software control program is typically loaded by an operator selecting from a number of available production routes and recipes through a user interface. The operator loads a particular process recipe that includes information such as the chambers that will be used to process the semiconductor wafer, the parameters for processing, and other information.

Maintenance and testing of the chambers is a major business issue since an improperly operating chamber may cause downtime, resulting in lost production revenues. Conventional machine tools require that the cluster tool be taken offline for maintenance and testing. Consequently, a difficulty that arises in conventional equipment is that the individual chambers cannot necessarily be manually controlled while the equipment is in operation (i.e. the production route in running).

What is needed is a system that allows unused chambers to be manually controlled, tested and maintained while the equipment is in operation.

SUMMARY

The present invention relates to a distributed control system for semiconductor manufacturing equipment, and more particularly to a computer controlled apparatus and method for improving semiconductor processing. The invention advantageously allows unused chambers to be manually controlled, tested and maintained while the equipment is in operation.

A semiconductor workpiece processing tool according to an embodiment of the invention includes a plurality of process modules for processing the workpiece, where a number of the process modules include a robot loading window and a manual loading window. A control system is provided for managing operation of the processing tool including a production route defining movement of the workpiece among a number of the process modules. The control system includes a user interface through which an operator can define the production route and recipes to be performed on the workpiece in each of the process modules, a system controller for controlling execution of the production route, a process module controller associated with each of the process modules for controlling the processing of the workpiece in the process module, and a network connecting the user interface, system controller and each process module controller. The system controller provides each process module controller with the recipe name, which is retrieved over the network The production route includes a number of online process modules defined in the production route. In the exemplary embodiment, at least one offline process module not included in the production route, and an offline process module can accept a workpiece through the manual window and to perform a recipe thereon.

In one aspect of the invention, the user interface is a graphical user interface. In another aspect of the invention, each process module controller is capable of retrieving the recipe over the network based on the recipe name. In yet another aspect of the invention, the offline module may be configured to perform testing, maintenance or other operation while the production route is in operation.

Advantages of the invention include the ability to continue a production route while manually operating a process module. As a result, the tool may continue in operation while selected process module are tested, maintained or otherwise used to process workpieces. This feature of continued operation while certain process modules undergo maintenance and testing can result in significant productivity improvements since the production line does not need to stop when a process module is undergoing maintenance and testing.

BRIEF DESCRIPTION OF THE DRAWINGS

The foregoing and other features, aspects, and advantages will become more apparent from the following detailed description when read in conjunction with the following drawings, wherein:

FIGS. 4A–B are flow charts showing operation of the invention according to an embodiment of the invention.

DETAILED DESCRIPTION

As will be described below, the present invention provides a distributed control system for semiconductor manufacturing equipment, and more particularly a computer controlled apparatus and method for improving semiconductor processing. Reference will now be made to the drawings wherein like numerals refer to like parts throughout.

A. Cluster Tool Modular Architecture

Figure 1A:
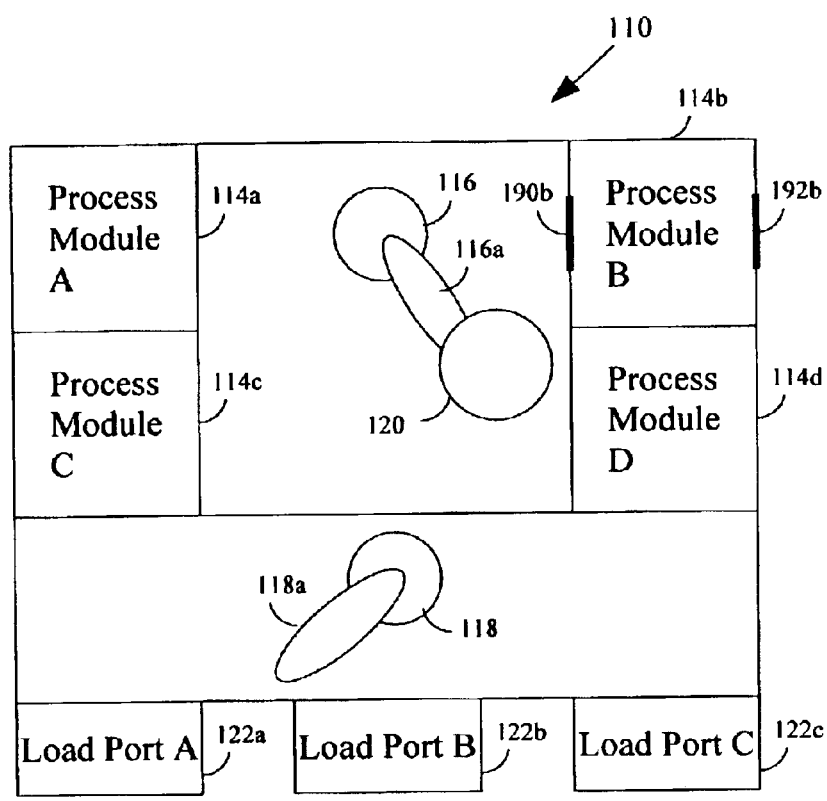
FIGS. 1A–B depict a cluster tool and control system according to an embodiment of the invention.
Figure 1B:
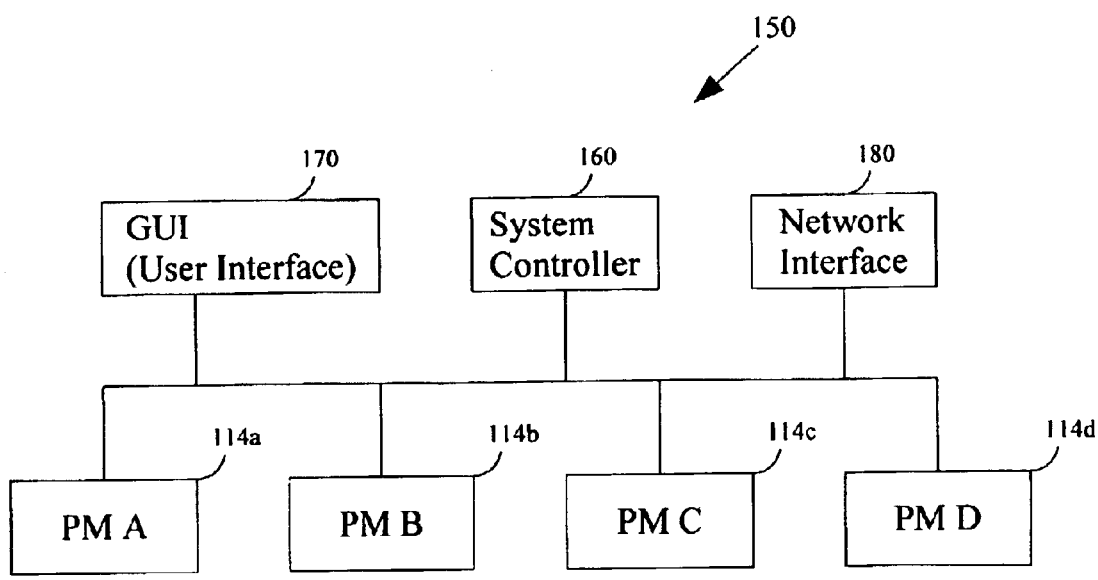

FIGS. 1A–B depict a cluster tool 110 and control system 150 according to an embodiment of the invention. The cluster tool 110 is a modular design that provides for a potential variety of process modules 114. The process modules may be of any type used in semiconductor processing, for example, chemical mechanical polishing (CMP), electro-chemical deposition (ECD), electro-chemical mechanical polishing (ECMD), cleaning, annealing, etc. Robots 116 and 118 are provided inside the tool, which provides a mechanism for moving a workpiece 120 among the process modules. The workpiece is typically a silicon wafer that may have integrated circuits built therein. A detailed description of the tool is provided in Prov. No. 60/357,148, filed Feb. 15, 2002 and incorporated by reference herein.

The movement of the workpiece in the tool is called the production route, which is supervised by control system 150. The production route is important since it specifies the process modules that will be used during the processing. The production route may also include certain recipes that are performed in the various process modules. As shown, control system 150 includes a graphical user interface 170 (GUI) through which an operator can define the production route and recipes to be performed on the workpiece in each of the process modules. A system controller 170 is provided for controlling execution of the production route. Each of the process modules 114 includes a controller associated for controlling the processing of the workpiece in the process module. The control system components are coupled together as a local area network (LAN), which may have access through network interface 180 to a wide area network (WAN), or even a global network such as the Internet. This allows the tool to communicate with various other systems as described below.

The process modules 114 include a robot loading window and a manual loading window. For example, referring to FIG. 1A, process module B (114b) includes a robot window 190b and manual window 192b, and the other process modules 114a–114d have similar windows. However, the invention does not require that all the process modules have such windows because it may be desirable in some circumstances to have process modules that only have one or the other window. The robot loading window is inside the machine and accessible to the robot. The manually loading window is on the outside of the machine for operator access. One advantage to the manual access window is that an operator can perform maintenance and testing on the process chambers as needed. It is not necessary that all of the process modules have a manual loading window since there may be process modules that do not need maintenance and testing, or that require the production route to be halted for maintenance, etc.

While four process modules 114a–114d are depicted, any number may be used in the invention. Likewise, while two robots 116 and 118, and three load ports 122a–122c are depicted, any number may be used in the invention.

Figure 2A:
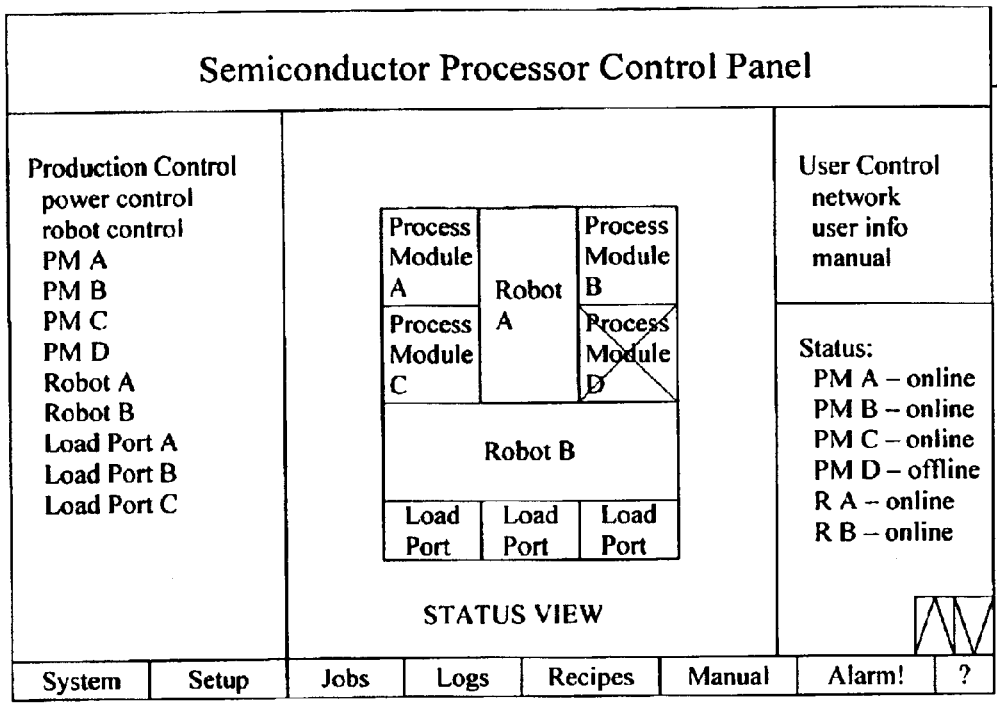
FIGS. 2A–B depict a user interface for the cluster tool according to an embodiment of the invention.
Figure 2B:
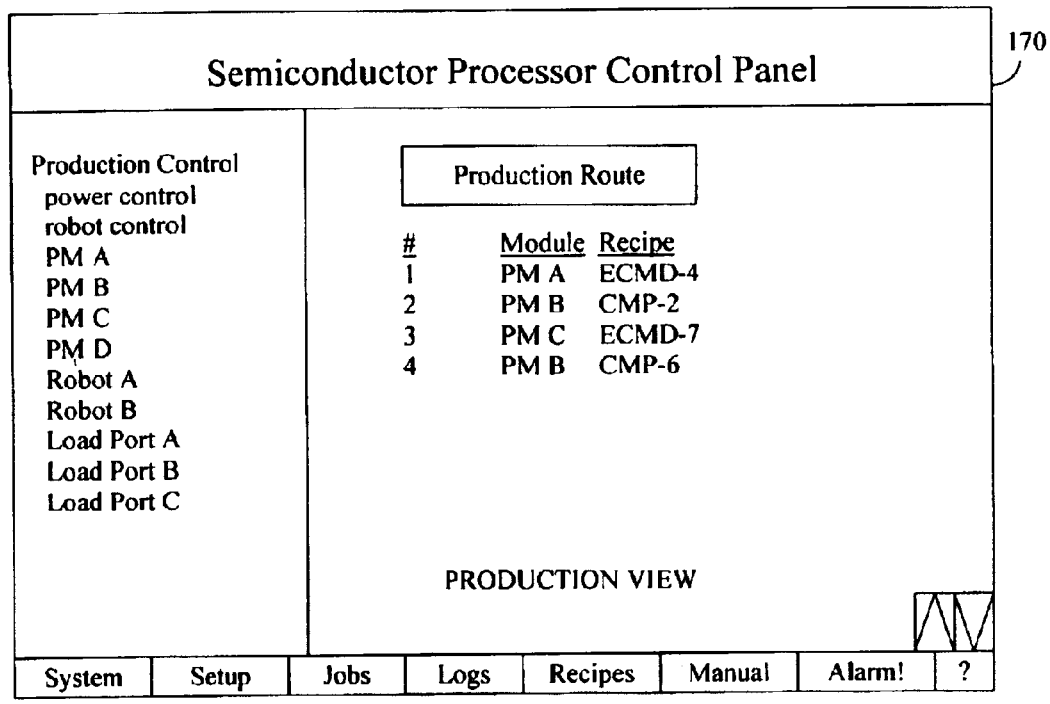

FIGS. 2A–B depict a user interface 170 for the cluster tool according to an embodiment of the invention. The user interface provides an operator with the ability to view the status of the tool and determine which process modules are online and offline, as shown in FIG. 2A. It also allows the operator to set up the production route and select various recipes that will be used by the process modules on the workpiece, as shown in FIG. 2B. Interface is a touch screen apparatus, but can also include other interface components such as a keyboard, pointing device, etc.

In one aspect of the invention, the production route includes a number of online process modules defined in the production route. In the exemplary aspect, at least one offline process module is not included in the production route. Referring to FIG. 2A, process modules A, B and C are online and process module D is offline. An offline process module can accept a workpiece through the manual window and to perform a recipe thereon. This feature of continued operation while certain process modules undergo maintenance and testing can improve productivity since the production line does not need to stop when a process module is undergoing maintenance and testing.

For each wafer, the system controller is also loaded with the name of the process sequence, or recipe name that is needed for that wafer, with various portions of the process sequence performed by different processing stations. When sending a particular wafer to a particular process module, the recipe name is sent in a command by the system controller to a processing station module, and that process can then take place, which then also allows tracking of the wafers that are being routed.

Each of the various subsystems that are referred to herein preferably contain computer control that allow each of the various subsystems to operate in the integrated system and independently. During operation with the integrated system, the electronic control of each particular subsystem works with the system controller to ensure that operations with other subsystems and the wafer handling system are synchronized with the overall system operation. During operation of each subsystem independently, the electronic control of the particular subsystem is capable of controlling the operations performed by that particular subsystem. Accordingly, since subsystems can be used together and independently, the same subsystems can be used in a greater variety of configurations, thus increasing their flexibility.

B. Control System

Figure 3A:
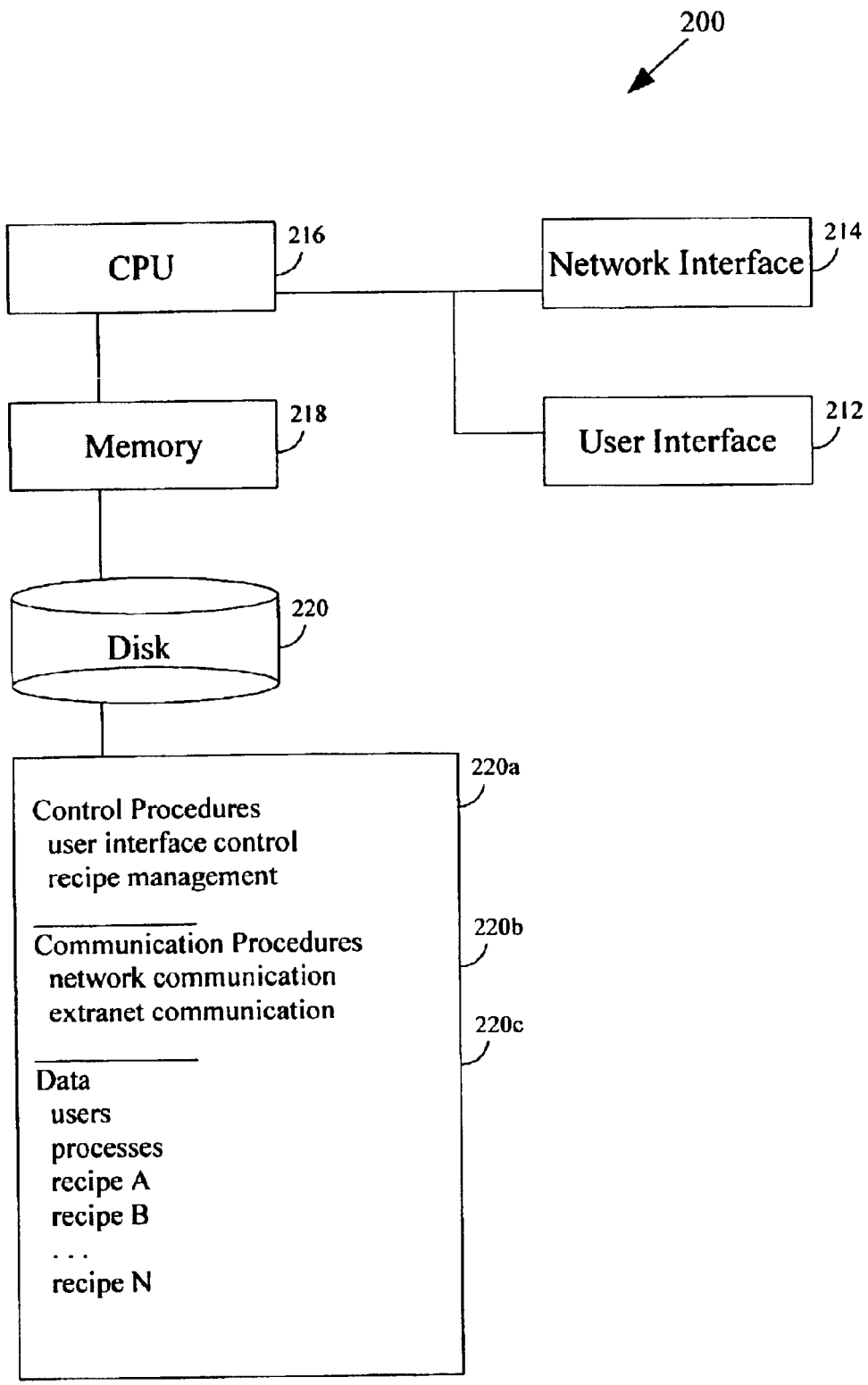
FIGS. 3A–C depict computer control elements of the control system according to an embodiment of the invention.
Figure 3B:
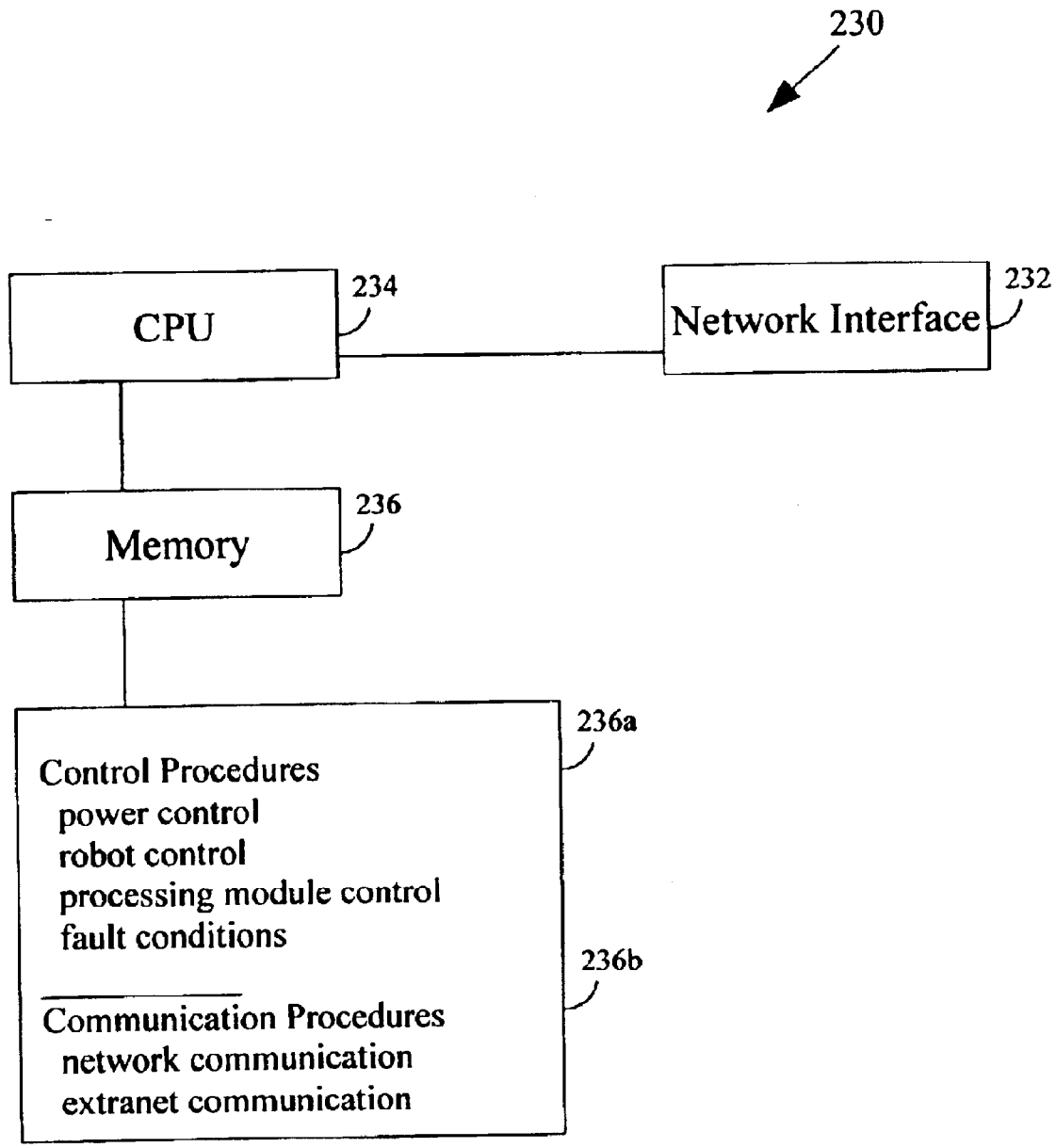
Figure 3C:
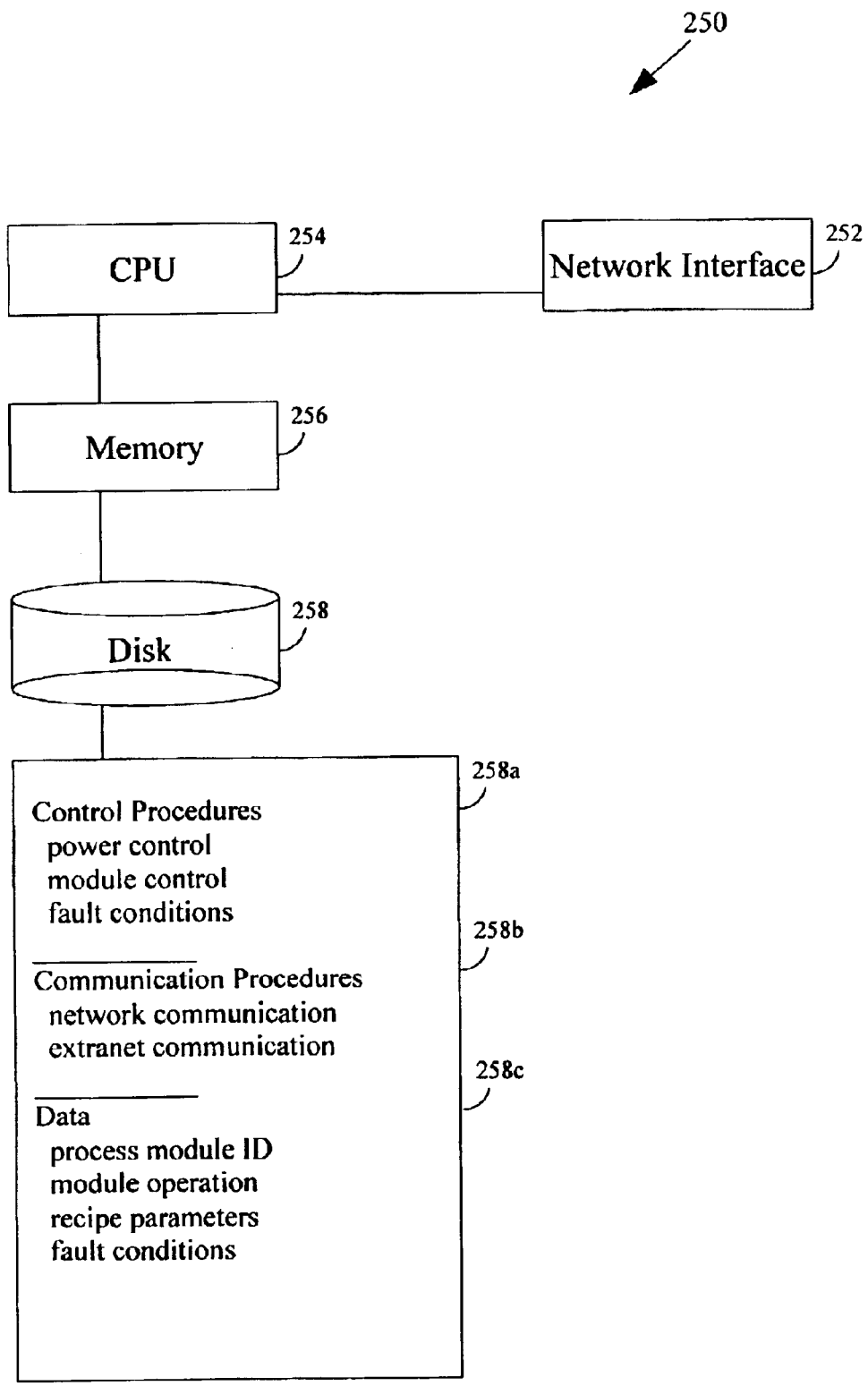

FIGS. 3A–C depict computer control elements of the control system according to an embodiment of the invention. FIG. 3A shows the graphical user interface (GUI) computer 200 that the operator interfaces with to program and monitor the tool. The GUI computer includes an interface 212 for the operator and a network interface to communicate over the LAN with the other control system components. A central processing using 216 (CPU) controls the storage, communication and data processing, for example, production route selection and storage. A memory 218 and disk 220 store the routines necessary to operate the GUI and program, control and monitor the tool. The memory includes control procedures 220a that are used for the GUI control and recipe management, communication procedures 220b that are used for network communication, and data that includes the users, processes (e.g. production routes), recipes, etc.

Once the tool is commanded by the GUI to begin operation, a system controller 230 manages the production route. The system controller control procedures 236a include robot control and processing module control. The system controller also includes standard communications procedures to communicate with the other network components over the LAN. In operation, the system controller manages the robot operation that delivers the workpieces to the process modules and retrieves the workpieces from the process modules. The system controller also informs the process modules of the particular recipe that they will perform.

The process module controller 250 has a substantially autonomous role in the system. The process module controller accepts the wafer from the robot under the control of the system controller and also receives the name of the recipe to be performed. The process module controller then seeks out the recipe, which may be stored with in the tool at the GUI computer, outside the tool on another LAN and WAN, or elsewhere on an accessible network. The process module controller stores the recipe as data in its memory 258c. The control procedures 258a then execute the recipe and the communications procedures inform the system controller when the process is complete.

While the modular cluster tool has been described with reference to possible configurations, an operational example will help to demonstrate additional features of the invention.

C. Operational Example

FIGS. 4A–B are flow charts showing operation of the invention according to an embodiment of the invention. These operational examples may be performed simultaneously if desired, but that is not required by the invention since there may be times when an operator may wish to manually operate several process modules without the tool performing a production route.

FIG. 4A shows a sample production route flowchart example 300 where at step 302 the workpiece is retrieved, for example, from a load port cassette and brought into the tool by the robot 118. In step 304, the system controller instructs the robot to send the wafer to process module X (PM X), where X is used as a reference to an arbitrary process module which would depend on the production route. In step 306, PM X agrees to accept the wafer, and in step 308, the system controller sends the recipe name to PM X. In step 310, PM X retrieves the recipe from the network, which could be the LAN, a WAN or other network. In step 312, PM X processes the wafer according to the recipe, and then in step 314, PM X sends a signal to the system controller indicating that the recipe is done. In step 316, the system controller instructs the robot to retrieve the wafer from PM X. If the production route is not complete, step 318 returns the production route processing to step 304 which continues the production route. If the production route is complete, step 320 ends the process and the robot returns the wafer to the load port cassette.

FIG. 4B is a flowchart showing an exemplary manual operation. In step 354, process module X (PM X) is enabled through the GUI computer, where X is used as a reference to an arbitrary process module. In step 356, the wafer is manually inserted into PM X. In step 358, the operator sends the recipe to PM X using the GUI computer. In step 360, PM X retrieves the recipe from the network, which could be the LAN, a WAN or other network. In step 362, PM X processes the wafer according to the recipe, and then in step 364, PM X sends a signal to the GUI computer indicating that the recipe is done. In step 366, the wafer is manually retrieved from PM X by the operator, and then step 368 completes the operation. As stated above, these operational examples may be performed simultaneously if desired, but that is not required by the invention since there may be times when an operator may wish to manually operate several process modules without the tool performing an production route.

D. Conclusion

Advantages of the invention include the ability to continue a production route while manually operating a process module. As a result, the tool may continue in operation while selected process module are tested, maintained or otherwise used to process workpieces. This feature of continued operation while certain process modules undergo maintenance and testing can result in significant productivity improvements since the production line does not need to stop when a process module is undergoing maintenance and testing.

Having disclosed exemplary embodiments and the best mode, modifications and variations may be made to the disclosed embodiments while remaining within the subject and spirit of the invention as defined by the following claims.

What is claimed is:

1. A semiconductor workpiece processing tool comprising:
   a plurality of process modules for processing the workpiece, where a number of the process modules, each including a robot loading window and a manual loading window;
   a control system for managing operation of the processing tool including a production route defining movement of the workpiece among a number of the process modules, wherein the control system includes:
   (a) a user interface through which an operator can define the production route and recipes to be performed on the workpiece in each of the process modules;
   (b) a system controller for controlling execution of the production route;
   (c) a process module controller associated with each of the process modules for controlling the processing of the workpiece in the process module; and
   (d) a network connecting the user interface, system controller and each process module controller;
   wherein the production route includes a number of online process modules defined in the production route and at least one offline process module not included in the production route; and
   an offline process module can accept a workpiece through the manual window and to perform a recipe thereon.

2. The processing tool of claim 1, wherein:
   the user interface is a graphical user interface.

3. The processing tool of claim 1, wherein:
   each process module controller is capable of retrieving a recipe over the network based on a recipe name.

4. The processing tool of claim 1, wherein:
   the offline process module can be configured to perform testing, maintenance or other operation while the production route is in operation.

5. A method of processing a workpiece using a semiconductor workpiece processing tool including a plurality of process modules, each having a robot loading window and a manual loading window, and a control system including a user interface, system controller and process module controller associated with the process modules, comprising the steps of:
   storing a production route defining movement of the workpiece among a number of the process modules, wherein the production route includes a number of online process modules defined in the production route and at least one offline process module not included in the production route;
   storing a number of recipes for processing the workpiece, the recipes each having a unique name and a number of processing parameters associated therewith;
   moving the workpieces among the process modules in accordance with the production route; and
   processing a workpiece in an offline process module accepted through the manual window and performing a recipe thereon.

6. The method of claim 5, wherein:
   the storing steps include entering information through a graphical user interface.

7. The method of claim 5, further comprising the step of:
   each process module controller retrieving a recipe over the network based on a recipe name.

8. The method of claim 5, further comprising the step of:
   performing maintenance on an offline process module while the production route is in operation.

* * * * *